US012729457B2

(12) United States Patent
Mori et al.

(10) Patent No.: US 12,729,457 B2
(45) Date of Patent: Sep. 8, 2026

(54) GROUP III NITRIDE CRYSTAL MANUFACTURING APPARATUS HAVING A GROWTH CHAMBER THAT INCLUDES A MULTILAYER BODY OR A POROUS BODY MADE OF AT LEAST ONE ELEMENT HAVING A CATALYTIC EFFECT FOR A DECOMPOSITION REACTION OF A NITROGEN ELEMENT-CONTAINING GAS

(71) Applicant: Panasonic Holdings Corporation, Osaka (JP)

(72) Inventors: Yusuke Mori, Suita (JP); Masashi Yoshimura, Suita (JP); Masayuki Imanishi, Suita (JP); Shigeyoshi Usami, Suita (JP); Akira Kitamoto, Suita (JP); Junichi Takino, Osaka (JP); Masayuki Hoteida, Osaka (JP); Shunichi Matsuno, Kyoto (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 17/725,958

(22) Filed: Apr. 21, 2022

(65) Prior Publication Data

US 2022/0341056 A1 Oct. 27, 2022

(30) Foreign Application Priority Data

Apr. 23, 2021 (JP) ................................ 2021-073613

(51) Int. Cl.
*C30B 35/00* (2006.01)
*C30B 25/02* (2006.01)
*C30B 29/38* (2006.01)

(52) U.S. Cl.
CPC ............. *C30B 29/38* (2013.01); *C30B 25/02* (2013.01); *C30B 35/00* (2013.01)

(58) Field of Classification Search
CPC ......... C30B 25/00; C30B 25/02; C30B 25/08; C30B 25/14; C30B 25/16; C30B 25/165;
(Continued)

(56) References Cited

U.S. PATENT DOCUMENTS 4,169,814 A * 10/1979 Inaba .................... C01B 21/265
423/237
6,331,281 B1 12/2001 Teru et al.
(Continued)

FOREIGN PATENT DOCUMENTS

JP 5-198520 8/1993
JP 2000-233117 8/2000
(Continued)

OTHER PUBLICATIONS

Majima, et al. publication entitled “Development of ammonia gas removal device,” SEI Technical Review, No. 74, pp. 91-94 (2012). (Year: 2012).*

(Continued)

*Primary Examiner* — Kenneth A Bratland, Jr.
(74) *Attorney, Agent, or Firm* — Wenderoth, Lind & Ponack, L.L.P.

(57) ABSTRACT

A group III nitride crystal manufacturing apparatus includes a raw material chamber generating a group III elemental oxide gas, and a growth chamber allowing the group III element oxide gas supplied from the raw material chamber to react with a nitrogen element-containing gas to generate a group III nitride crystal on a seed substrate, and the growth chamber incudes a decomposition promoting part promoting decomposition of the unreacted nitrogen element-containing gas between the seed substrate and an exhaust port for discharging the unreacted group III oxide gas and the nitrogen element-containing gas.

16 Claims, 2 Drawing Sheets

(58) Field of Classification Search

CPC ......... C30B 29/00; C30B 29/10; C30B 29/40; C30B 29/403; C30B 29/406; C30B 35/00; C30B 35/002; C23C 16/22; C23C 16/30; C23C 16/301; C23C 16/303; C23C 16/44; C23C 16/4412

USPC ..... 117/84, 88, 99, 102, 200, 204, 937, 952; 118/715, 722, 724, 726

See application file for complete search history.

(56) References Cited

U.S. PATENT DOCUMENTS 7,591,987 B1 * 9/2009 Kato .................. B01D 53/8634 422/177
2001/0047750 A1 12/2001 Ishida
2009/0060809 A1 * 3/2009 Shioya ................. B01J 29/7615 423/237
2014/0322124 A1 10/2014 Izaki et al.
2016/0268129 A1 * 9/2016 Mori ................... C23C 16/4488
2020/0017993 A1 * 1/2020 Mori ....................... C30B 25/02
2020/0255975 A1 8/2020 Mori et al.

FOREIGN PATENT DOCUMENTS

JP 3179864 B2 * 6/2001
JP 2001-345268 12/2001
JP 2013-252989 12/2013
JP 2014-214060 11/2014
JP 2020-125221 8/2020
WO 2015/053341 4/2015

OTHER PUBLICATIONS

Notification of Reasons for Refusal issued Nov. 5, 2024 in corresponding Japanese Patent Application No. 2021-073613, with English machine translation.

Office Action issued Apr. 1, 2025 in Japanese Patent Application No. 2021-073613, with English-language Translation.

* cited by examiner 100
101
102
103
104
105
106
106
107
108
109
110
110
111
112
113
114
REACTOR CROSS-SECTIONAL AREA
118
115
115
116
117
120
119
119

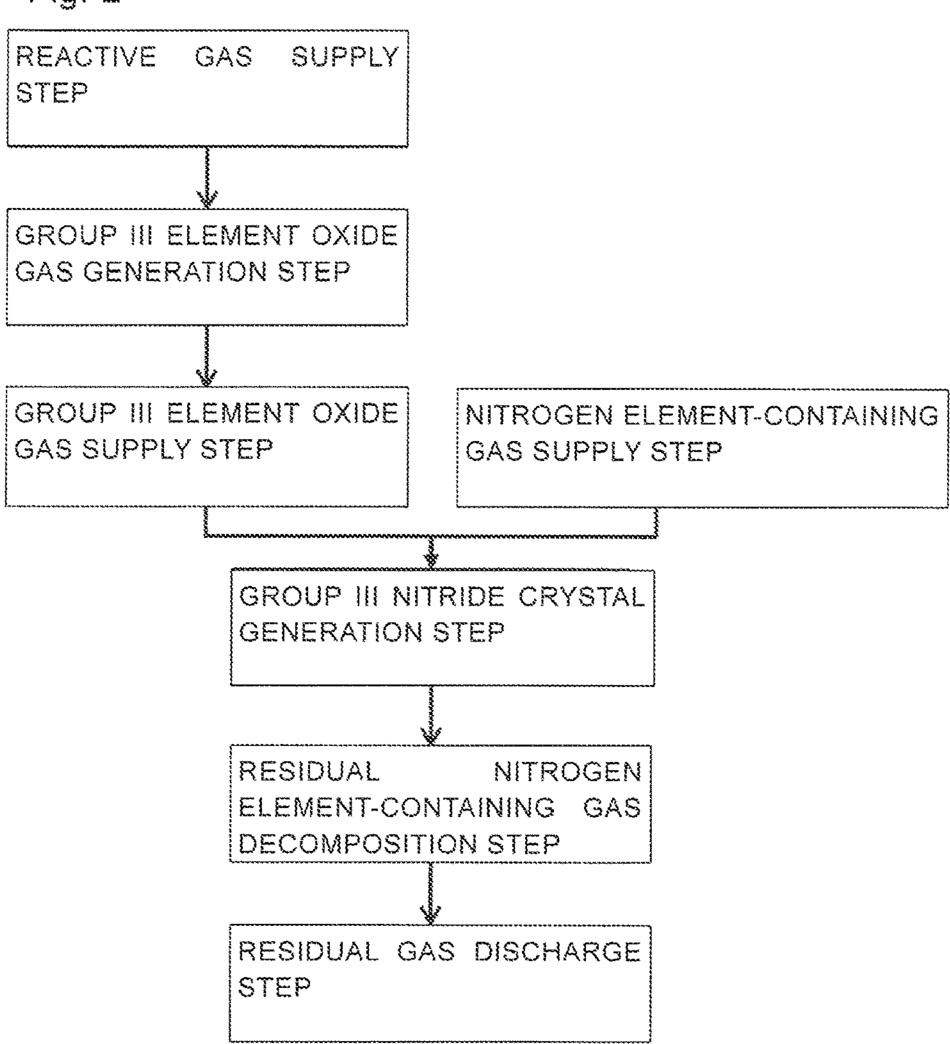
Fig. 2
REACTIVE GAS SUPPLY STEP
GROUP III ELEMENT OXIDE GAS GENERATION STEP
GROUP III ELEMENT OXIDE GAS SUPPLY STEP
NITROGEN ELEMENT-CONTAINING GAS SUPPLY STEP
GROUP III NITRIDE CRYSTAL GENERATION STEP
RESIDUAL NITROGEN ELEMENT-CONTAINING GAS DECOMPOSITION STEP
RESIDUAL GAS DISCHARGE STEP

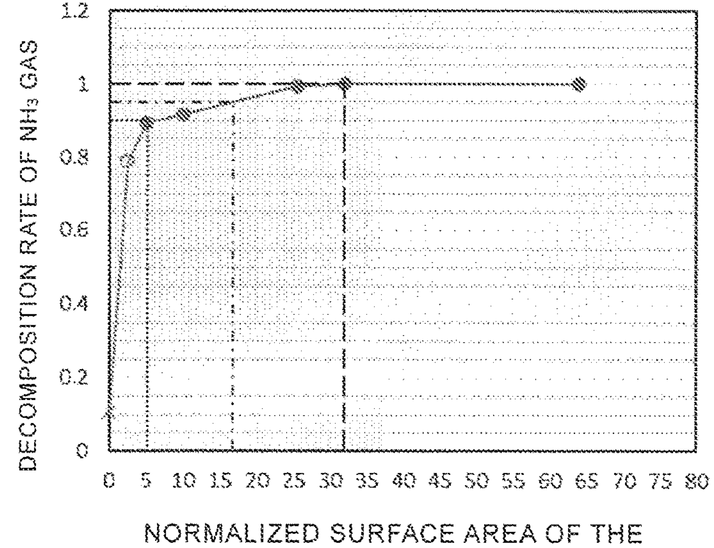
Fig. 3
DECOMPOSITION RATE OF NH3 GAS
0
0.2
0.4
0.6
0.8
1
1.2
0 5 10 15 20 25 30 35 40 45 50 55 60 65 70 75 80
NORMALIZED SURFACE AREA OF THE DECOMPOSITION PROMPTING PART

GROUP III NITRIDE CRYSTAL MANUFACTURING APPARATUS HAVING A GROWTH CHAMBER THAT INCLUDES A MULTILAYER BODY OR A POROUS BODY MADE OF AT LEAST ONE ELEMENT HAVING A CATALYTIC EFFECT FOR A DECOMPOSITION REACTION OF A NITROGEN ELEMENT-CONTAINING GAS

CROSS-REFERENCE TO RELATED APPLICATIONS

This application claims a priority of Japanese Patent Application No. 2021-73613 filed on Apr. 23, 2021, the contents of which is incorporated herein by reference.

BACKGROUND

1. Technical Field

The present invention relates to a group III nitride crystal manufacturing apparatus and manufacturing method.

2. Description of the Related Art

Group III nitride crystals of GaN etc. are expected to be applied to next-generation optical devices such as high-output LEDs (light emitting diodes) and LDs (laser diodes), and next-generation electronic devices such as high-output power transistors mounted on EVs (electric vehicles) and PHVs (plug-in hybrid vehicles). An Oxide Vapor Phase Epitaxy (OVPE) method using a group III oxide as a raw material is used as a method of manufacturing a group III nitride crystal (see, e.g., WO 2015/053341).

An example of a reaction system in the OVPE method is as follows. Ga is heated, and $H_2O$ gas is introduced in this state. The introduced $H_2O$ gas reacts with Ga to generate $Ga_2O$ gas (Formula (I)). $NH_3$ gas is introduced and the $NH_3$ gas is reacted with the generated $Ga_2O$ gas to generate a GaN crystal on a seed substrate (Formula (II)).

$$2Ga(I)+H_2O(g)\rightarrow Ga_2O(g)+H_2(g) \quad (I)$$

$$Ga_2O(g)+2NH_3(g)\rightarrow 2GaN(s)+H_2O\ (g)+2H_2(g) \quad (II)$$

However, in the manufacturing method described in WO 2015/053341, when the group III nitride crystal is grown, an unreacted group III oxide gas may react with a nitrogen element-containing gas in a downstream portion of the group III nitride crystal, and parasitic growth of a group III nitride crystal may occur on wall portions of a reactor and an exhaust piping. The parasitically grown group III nitride crystal (hereinafter referred to as "parasitic crystal") has a coefficient of thermal expansion different from the material of the reactor wall portion. Due to a difference in the coefficient of thermal expansion between the reactor wall portion and the parasitic crystal, a damage or deterioration such as cracking or chipping of the reactor may occur in the process of raising and lowering the temperature in manufacturing of the group III nitride crystal. Furthermore, the parasitic crystal generated on the reactor wall portion serves as a particle source in a growth space of the group III nitride crystal. Therefore, particles of the parasitic crystal may be scattered on the group III nitride crystal grown on the seed substrate, and abnormal growth such as polycrystallization of the grown crystal and generation of pits is likely to occur. If the parasitic growth occurs in an exhaust pipe portion, this may hinder long-term growth due to blockage of the exhaust piping.

SUMMARY

The present disclosure was conceived in view of the situations, and it is therefore one non-limiting and exemplary embodiment provides a group III nitride crystal apparatus and manufacturing method capable of suppressing parasitic growth and manufacturing a high-quality group III nitride crystal.

In one general aspect, the techniques disclosed here feature: a group III nitride crystal manufacturing apparatus according to a first aspect, includes:

- a raw material chamber generating a group III elemental oxide gas; and
- a growth chamber allowing the group III element oxide gas supplied from the raw material chamber to react with a nitrogen element-containing gas to generate a group III nitride crystal on a seed substrate,
- wherein the growth chamber incudes a decomposition promoting part promoting decomposition of the unreacted nitrogen element-containing gas between the seed substrate and an exhaust port for exhausting the unreacted group III oxide gas and the nitrogen element-containing gas.

In another general aspect, the techniques disclosed here feature: a group III nitride crystal manufacturing method includes:

- allowing a group III element source to react with a reactive gas to generate a group III element oxide gas;
- allowing the group III element oxide gas to react with a nitrogen element-containing gas to generate a group III nitride crystal on a seed substrate; and
- decomposing a portion of the unreacted nitrogen element-containing gas between the seed substrate and an exhaust port for discharging the unreacted group III oxide gas and the nitrogen element-containing gas.

According to the group III nitride crystal apparatus and manufacturing method according to the present disclosure, parasitic growth can be suppressed, and a high-quality group III nitride crystal can be manufactured.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which:

FIG. 2 is a flowchart showing a group III nitride crystal manufacturing method according to an embodiment of the present disclosure; and FIG. 3 is a graph showing a relationship between a normalized surface area of a decomposition promoting part normalized by a cross-sectional area of a growth chamber and a decomposition rate of $NH_3$ gas.

DETAILED DESCRIPTION

Figure 1:
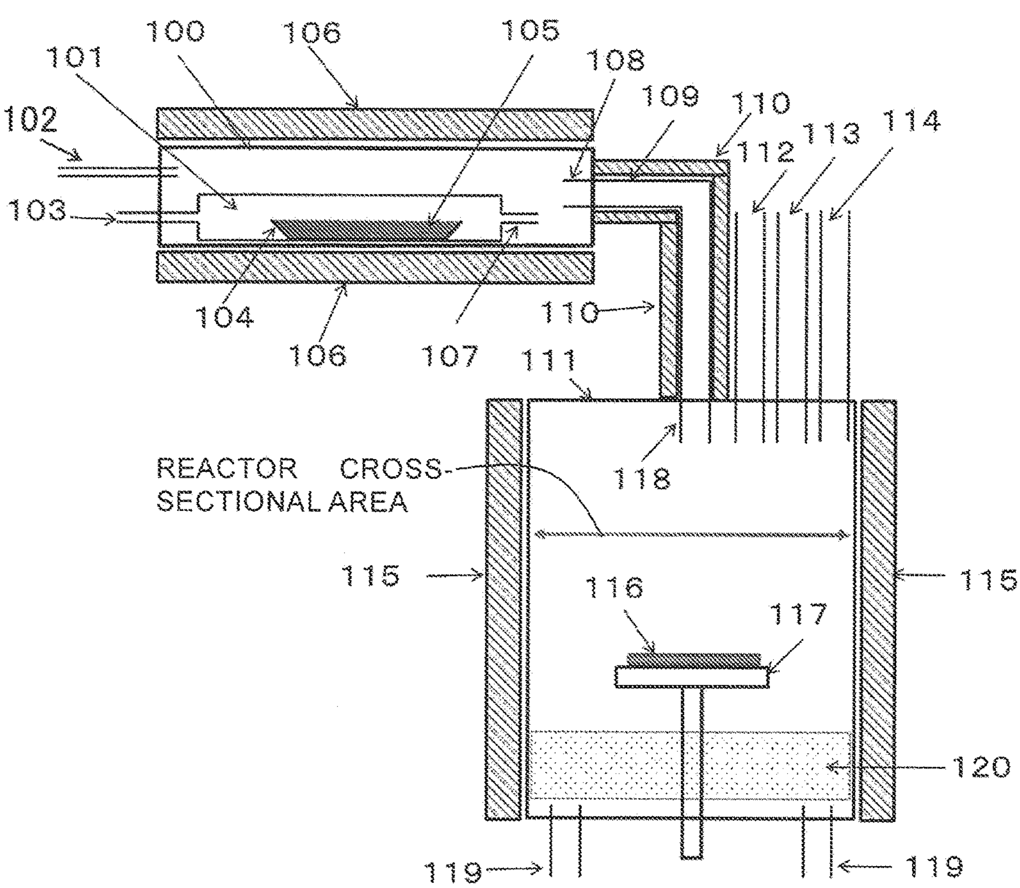
FIG. 1 is a schematic cross-sectional view showing a configuration of a group III nitride crystal manufacturing apparatus according to an embodiment of the present disclosure.

A group III nitride crystal manufacturing apparatus according to a first aspect, includes:

a raw material chamber generating a group III elemental oxide gas; and a growth chamber allowing the group III element oxide gas supplied from the raw material chamber to react with a nitrogen element-containing gas to generate a group III nitride crystal on a seed substrate, wherein the growth chamber incudes a decomposition promoting part promoting decomposition of the unreacted nitrogen element-containing gas between the seed substrate and an exhaust port for exhausting the unreacted group III oxide gas and the nitrogen element-containing gas.

Further, as a group III nitride crystal manufacturing apparatus of a second aspect, in the first aspect, the decomposition promoting part may contain at least one element selected from the group consisting of Mo, Ni, Fe, Co, Ti, Cr, Zr, Ta, W, and Pt.

Further, as a group III nitride crystal manufacturing apparatus of a third aspect, in the first aspect, the total surface area of the decomposition promoting part may be 5 times or more the cross-sectional area of the growth chamber.

A group III nitride crystal manufacturing method, according to a fourth aspect, includes:

allowing a group III element source to react with a reactive gas to generate a group III element oxide gas;

allowing the group III element oxide gas to react with a nitrogen element-containing gas to generate a group III nitride crystal on a seed substrate; and decomposing a portion of the unreacted nitrogen element-containing gas between the seed substrate and an exhaust port for discharging the unreacted group III oxide gas and the nitrogen element-containing gas.

Hereinafter, a group III nitride crystal manufacturing apparatus and a group III nitride crystal manufacturing method according to embodiments will be described with reference to the accompanying drawings. In the drawings, substantially the same members are denoted by the same reference numerals.

First Embodiment

<Overview of Group III Nitride Crystal Manufacturing Apparatus>

An overview of a group III nitride crystal manufacturing apparatus of according to a first embodiment of this disclosure will be described with reference to a schematic cross-sectional view of FIG. 1. FIG. 1 is a schematic view, and constituent members may be different from actual members in terms of size, ratio, etc.

The group III nitride crystal manufacturing apparatus according to the first embodiment has a raw material chamber 100. A raw material reaction chamber 101 is disposed in the raw material chamber 100, and a raw material boat 104 with a starting group III element source 105 placed therein is disposed in the raw material reaction chamber 101. In the first embodiment, the starting group III element source 105 is a starting Ga source. A reactive gas supply pipe 103 supplying a reactive gas reactive with the starting group III element source 105 is connected to the raw material reaction chamber 101. The raw material reaction chamber 101 has a group III element oxide gas discharge port 107. When the starting group III element source 105 is an oxide, a reducing gas is used as the reactive gas. When the starting group III element source 105 is a metal, an oxidizing gas is used as the reactive gas. The raw material chamber 100 is provided with a first carrier gas supply port 102. The first carrier gas supplied from the first carrier gas supply port 102 carries a group III element oxide gas discharged from the group III element oxide gas discharge port 107 from a gas discharge port 108 through a connection pipe 109 to the growth chamber 111. The growth chamber 111 includes a gas supply port 118 supplying the group III element oxide gas and the first carrier gas, a third carrier gas supply port 112, a nitrogen element-containing gas supply port 113, a second carrier gas supply port 114, an exhaust port 119, and a decomposition promoting part 120. In the growth chamber 111, a substrate susceptor 117 for disposing the seed substrate 116 is arranged.

In the group III nitride crystal manufacturing apparatus of the present disclosure, the decomposition promoting part is disposed on the downstream side of the substrate susceptor 117 in the growth chamber. As a result, even when the unreacted group III element oxide gas and the nitrogen element-containing gas flow downstream of the substrate susceptor 117 in a crystal growth process, the nitrogen element-containing gas can be decomposed by the decomposition promoting part. Even if no decomposition promoting part is not included, the nitrogen element-containing gas may be decomposed to some extent by heat; however, the decomposition is not sufficient for preventing parasitic growth. By disposing the decomposition promoting part, the decomposition of the nitrogen element-containing gas can further be promoted. Therefore, the parasitic growth of group III nitride crystals can be suppressed on the reactor wall portion and the exhaust piping in the growth chamber. As a result, a damage to the reactor and the exhaust piping can be prevented, and the group III nitride crystal can be manufactured with high reliability. Additionally, since the damage in the growth chamber can be reduced, the maintenance cost can be suppressed, and the manufacturing cost of the group III nitride crystal can be reduced. By preventing the parasitic growth, the parasitically grown group III nitride crystal (parasitic crystal) can be prevented from serving as a particle source and scattering on the group III nitride crystal grown on the seed substrate. Therefore, abnormal growth such as polycrystallization and generation of pits can be suppressed, the quality of the group III nitride crystal can be improved.

<Overview of Group III Nitride Crystal Manufacturing Method>

An overview of a group III nitride crystal manufacturing method according to an embodiment of the present disclosure will be described with reference to a flowchart of FIG. 2. In this embodiment, the group III nitride crystal manufacturing method includes a reactive gas supply step, a group III element oxide gas generation step, a group III element oxide gas supply step, a nitrogen element-containing gas supply step, a group III nitride crystal generation step, a residual nitrogen element-containing gas decomposition step, and a residual gas discharge step.

<Reactive Gas Supply Step>

In the reactive gas supply step, the reactive gas is supplied from the reactive gas supply pipe 103 to the raw material reaction chamber 101 in the raw material chamber 100. As described above, a reducing gas or an oxidizing gas can be used as the reactive gas as appropriate.

<Group III Element Oxide Gas Generation Step>

In the group III element oxide gas generation step, the starting group III element source 105 is reacted with the reactive gas (a reducing gas when the starting group III element source is an oxide, or an oxidizing gas when the starting group III element source is a metal) in the raw material reaction chamber 101 to generate a group III element oxide gas.

<Group III Element Oxide Gas Supply Step>

In the group III element oxide gas supply step, the group III element oxide gas produced in the group III element oxide gas generation step is supplied to the growth chamber 111. The group III element oxide gas is discharged from inside the raw material reaction chamber 101 through the group III element oxide gas discharge port 107, discharged from the gas discharge port 108 together with the first carrier gas supplied from the first carrier gas supply port 102, carried through the connection pipe 109, and supplied from the gas supply port 118 into the growth chamber 111.

<Nitrogen Element-Containing Gas Supply Step>

In the nitrogen element-containing gas supply step, the nitrogen element-containing gas is supplied from the nitrogen element-containing gas supply port 113 to the growth chamber 111.

<Group III Nitride Crystal Generation Step>

In the group III nitride crystal generation step, the group III element oxide gas supplied into the growth chamber 111 in the group III element oxide gas supply step is reacted with the nitrogen element-containing gas supplied into the growth chamber 111 in the nitrogen element-containing gas supply step to grow a group III nitride crystal on the seed substrate 116.

<Residual Nitrogen Element-Containing Gas Decomposition Step>

In the residual nitrogen element-containing gas decomposition step, the unreacted nitrogen element-containing gas is decomposed by the decomposition promoting part 120. This suppresses the parasitic growth of group III nitride crystals.

Although the flow chart includes an arrow between steps, steps shown in the flowchart may be performed at the same time. In the flow chart, an arrow is shown from a step performed upstream to a step performed downstream in the group III nitride crystal manufacturing apparatus.

<Residual Gas Discharge Step>

In the residual gas discharge step, the residual gas containing the unreacted group III oxide gas and nitrogen element-containing gas not contributing to the generation of a group III nitride crystal is discharged from the exhaust port 119 to the outside of the growth chamber 111.

<Details of Group III Nitride Crystal Manufacturing Method and Manufacturing Apparatus>

The details of the group III nitride crystal manufacturing apparatus and manufacturing method according to this embodiment will be described. In the first embodiment, metal Ga is used as the starting group III element source 105.

<Reactive Gas Supply Step>

In the reactive gas supply step, the reactive gas is supplied from the reactive gas supply pipe 103 to the raw material reaction chamber 101. In the first embodiment, since the metal Ga is used as the starting group III element source 105, $H_2O$ gas is used as the reactive gas. The reactive gas may be $O_2$ gas, CO gas, NO gas, $N_2O$ gas, $NO_2$ gas, or $N_2O_4$ gas.

<Group III Element Oxide Gas Generation Step>

In the group III element oxide gas generation step, the reactive gas supplied to the raw material reaction chamber 101 in the reactive gas supply step reacts with Ga serving as the starting group III element source 105 to generate $Ga_2O$ gas that is the group III element oxide gas. The generated $Ga_2O$ gas is discharged from the raw material reaction chamber 101 to the raw material chamber 100 through the group III element oxide gas discharge port 107. The discharged $Ga_2O$ gas is mixed with the first carrier gas supplied from the first carrier gas supply port 102 to the raw material chamber and is supplied to the gas discharge port 108.

In the first embodiment, the raw material chamber 100 is heated by a first heater 106. When the raw material chamber 100 is heated, the temperature of the raw material chamber 100 is preferably 800° C. or higher, which is higher than the boiling point of the $Ga_2O$ gas. Additionally, the temperature of the raw material chamber 100 is preferably made lower than that of the growth chamber 111. When the growth chamber 111 is heated by a second heater 115 as described later, the temperature of the raw material chamber 100 is preferably made lower than 1800° C., for example. The starting group III element source 105 is placed in the raw material boat 104 disposed in the raw material reaction chamber 101. The raw material boat 104 preferably has a shape capable of increasing a contact area between the reactive gas and the starting group III element source. For example, the raw material boat 104 preferably has a multi-stage dish shape so as to prevent the starting group III element source 105 and the reactive gas from passing through the raw material reaction chamber 101 in a non-contact state.

Methods of generating the group III element oxide gas are roughly classified into a method of reducing the starting group III element source 105 and a method of oxidizing the starting group III element source 105. For example, in the reducing method, an oxide (e.g., $Ga_2O_3$) is used as the starting group III element source 105, and a reducing gas (e.g., $H_2$ gas, CO gas, $CH_4$ gas, $C_2H_6$ gas, $H_2S$ gas, $SO_2$ gas) is used as the reactive gas.

On the other hand, in the method of oxidizing the starting group III element source 105, the starting group III element source 105 is a non-oxide (e.g., liquid Ga), and an oxidizing gas (e.g., $H_2O$ gas, $O_2$ gas, CO gas, NO gas, $N_2$) gas, $NO_2$ gas, $N_2O_4$ gas) is used as the reactive gas. In addition to the Ga source, an In source and an Al source may be used as the starting group III element source 105. The first carrier gas may be an inert gas, $H_2$ gas, etc.

<Group III Element Oxide Gas Supply Step>

In the group III element oxide gas supply step, the $Ga_2O$ gas generated in the group III element oxide gas generation step is supplied through the gas discharge port 108, the connection pipe 109, and the gas supply port 118 to the growth chamber 111. When the temperature of the connection pipe 109 connecting the raw material chamber 100 and the growth chamber 111 is lower than the temperature of the raw material chamber 100, a reverse reaction of the reaction for generating the group III element oxide gas occurs, and the starting Ga source 105 may precipitate inside the connection pipe 109. Therefore, the connection pipe 109 is preferably heated by a third heater 110 so as to prevent the temperature from becoming lower than the temperature of the raw material chamber 100.

<Nitrogen Element-Containing Gas Supply Step>

The nitrogen element-containing gas is supplied from the nitrogen element-containing gas supply port 113 to the growth chamber 111. Examples of the nitrogen element-containing gas include $NH_3$ gas, NO gas, $NO_2$ gas, $N_2O$ gas, $N_2O_4$ gas, $N_2H_2$ gas, and $N_2H_4$ gas.

In the group III nitride crystal generation step, the raw material gas supplied into the growth chamber 111 through the supply steps is reacted to grow the group III nitride crystal on the seed substrate 116. The growth chamber 111 is preferably heated by the second heater 115 to a temperature at which the group III element oxide gas reacts with the nitrogen element-containing gas. In this case, to prevent the reverse reaction of the reaction for generating the group III element oxide gas from occurring, the temperature of the growth chamber 111 is preferably controlled so that the temperature of the growth chamber 111 does not become lower than the temperature of the raw material chamber 100 and the temperature of the raw connection pipe 109. The temperature of the growth chamber 111 heated by the second heater 115 is preferably 1000° C. or higher and 1800° C. or lower.

<Group III Nitride Crystal Generation Step>

By mixing the group III element oxide gas supplied to the growth chamber 111 through the group III element oxide gas supply step and the nitrogen element-containing gas supplied to the growth chamber 111 through the nitrogen element-containing gas supply step upstream of the seed substrate 116, the group III nitride crystal can be grown on the seed substrate 116

<Residual Nitrogen Element-Containing Gas Decomposition Step>

In the residual nitrogen element-containing gas decomposition step, the nitrogen element-containing gas not consumed in the group III nitride crystal generation step is inactivated by the decomposition promoting part 120. The decomposition promoting part 120 is disposed downstream of the seed substrate 116, i.e., downstream of the substrate susceptor 117 holding the seed substrate 116, so as not to inhibit the growth of the group III nitride crystal on the seed substrate 116. In other words, the decomposition promoting part 120 is disposed between the substrate susceptor 117 and the exhaust port 119. By decomposing and inactivating the nitrogen element-containing gas in the decomposition promoting part 120, the reaction of the nitrogen element-containing gas and the group III element oxide gas not used for the generation of the group III nitride crystal can be suppressed downstream of the seed substrate 116 so as to prevent the parasitic growth of group III nitride crystals on a reactor wall and an exhaust piping. Since the parasitic growth of group III nitride crystals is reduced on the reactor wall and the exhaust piping, the manufacturing can be performed with high reliability, and maintenance costs can be suppressed. Furthermore, an improvement in crystal quality is achieved by reducing particles caused by parasitic growth.

For example, when the group III nitride crystal is gallium nitride and $NH_3$ gas is used as the nitrogen element-containing gas, the decomposition reaction of the nitrogen element-containing gas is represented by Formula (III) below.

$$2NH_3(g) \rightarrow N_2(g)+3H_2(g) \quad \text{(III)}$$

The material of the decomposition promoting part 120 preferably contains an active metal from the viewpoint of the catalytic effect of the decomposition reaction of the nitrogen element-containing gas. Since the inside of the growth chamber 111 is in a high temperature environment of about 1200° C., it is necessary that the material constituting the decomposition promoting part 120 does not melt at the above temperature. Specifically, the decomposition promoting part 120 preferably contains at least one element selected from the group consisting of Mo, Ni, Fe, Co, Ti, Cr, Zr, Ta, W, and Pt. In particular, since Mo, Ta, W, Zr, Cr, and Pt have melting points of 1700° C. or higher, even when the growth chamber 111 is heated by using the second heater 115, deterioration due to softening and alloying with Ga hardly occurs and is less likely to react with the reactive gas. Therefore, it is more preferable that the decomposition promoting part 120 contains at least one element of Mo, Ta, Zr, Cr, and Pt.

From the viewpoint of promoting the decomposition of the nitrogen element-containing gas, the decomposition promoting part 120 preferably has a larger surface to improve a surface contact rate with the nitrogen element-containing gas. For example, when a single metal plate is used as the decomposition promoting part 120, the surface area of the decomposition promoting part 120 is a total area of the front and back surfaces thereof. From the viewpoint of improving the decomposition rate, the total surface area of the decomposition promoting part 120 is preferably a normalized surface area of 5 or more when the reactor cross-sectional area of the growth chamber 111 is normalized as 1, and the normalized surface area is more preferably 16.5 or more, and particularly preferably 32 or more. To increase the surface area of the decomposition promoting part 120, a punching plate-shaped multilayer body or a porous body may be used. The multilayer body is, for example, multiple metal plates arranged at intervals with respective spacers. Alternatively, a sponge-like metal, for example, sponge-like iron etc. may be used. The decomposition promoting part may be a carrier in which fine particles of Pt etc. are supported on an inner surface of a honeycomb structure of metal or ceramic. As a result, the nitrogen element-containing gas is decomposed downstream of the substrate susceptor 117, and the parasitic growth of group III nitride crystals can more efficiently be suppressed.

The reactor cross-sectional area is, for example, defined as a cross-sectional area perpendicular to the flowing direction of the group III element oxide gas and the nitrogen element containing gas in the growth chamber.

The shape of the decomposition promoting part 120 may be any shape not hindering the discharge of gas from the exhaust port 119. The decomposition promoting part 120 may have, for example, a plate shape or an annular shape. The decomposition promoting part 120 is preferably disposed downstream of the substrate susceptor in a region where the temperature is 800° C. or higher from the viewpoint of promoting the decomposition of the nitrogen element-containing gas.

The concentration of the group III element oxide gas and the nitrogen element-containing gas may be controlled by supplying a second carrier gas from the second carrier gas supply port 114 to the growth chamber 111. In this case, the parasitic growth of group III nitride crystals can be suppressed on the furnace wall of the growth chamber 111 and the substrate susceptor 117.

Examples of the seed substrate 116 include gallium nitride, gallium arsenide, silicon, sapphire, silicon carbide, zinc oxide, gallium oxide, and $ScAlMgO_4$.

An inert gas, $H_2$ gas, etc. can be used as the second carrier gas.

The unreacted group III element oxide gas and nitrogen element-containing gas, and the residual gas such as the first carrier gas, the second carrier gas, and the third carrier gas are discharged from the exhaust port 119.

EXAMPLES

Overview of Examples and Comparative Example

A group III nitride crystal was grown by using a growth furnace that is the group III nitride crystal manufacturing apparatus shown in FIG. 1. GaN was grown as the group III nitride crystal. Liquid Ga was used as the starting group III element source, Ga was reacted with $H_2O$ gas that is a reactive gas, and the generated $Ga_2O$ gas was used as the group III element oxide gas. $NH_3$ gas was used as the nitrogen element-containing gas, and a mixture of $H_2$ gas and $N_2$ gas was used as the first carrier gas and the second carrier gas. A GaN self-standing substrate was used as the seed substrate. The growth time was set to 1 hour for the verification. The decomposition rate of $NH_3$ was measured by using gas chromatography.

Example 1

For the growth conditions, the substrate temperature was 1200° C. and the raw material temperature was 1100° C. The partial pressure of $Ga_2O$ gas was 0.00108 atm, the partial pressure of $H_2O$ gas was 0.00045 atm, the partial pressure of $NH_3$ gas was 0.15748 atm, the partial pressure of $H_2$ gas was 0.71850 atm, and the partial pressure of $N_2$ gas was 0.12249 atm, and crystal growth was performed for 1 hour. As the decomposition promoting part, an annular-shaped porous Ni having a surface area 25.527 times the cross-sectional area of the reactor (normalized surface area of 25.527) was disposed downstream of the substrate susceptor, i.e., between the substrate susceptor and the exhaust port.

As a result of growing GaN, the growth rate of GaN grown on the seed substrate was 94 μm/h, and the decomposition rate of $NH_3$ was 99.5%. No parasitic growth of GaN was confirmed on the reactor wall or exhaust piping downstream of the substrate susceptor. The decomposition rate of $NH_3$ was calculated from the $NH_3$ gas concentration in the total gas flowing into the growth chamber and the $NH_3$ gas concentration at the exhaust port.

Example 2

For the growth conditions, the temperature of the growth chamber was 1200° C. and the temperature of the raw material chamber was 1100° C. The partial pressure of $Ga_2O$ gas was 0.00106 atm, the partial pressure of $H_2O$ gas was 0.00048 atm, the partial pressure of $NH_3$ gas was 0.15749 atm, the partial pressure of $H_2$ gas was 0.71849 atm, and the partial pressure of $N_2$ gas was 0.12249 atm, and crystal growth was performed for 1 hour. As the decomposition promoting part, an annular-shaped porous Ni having a surface area 31.909 times the cross-sectional area of the reactor (normalized surface area of 31.909) was disposed downstream of the substrate susceptor, i.e., between the substrate susceptor and the exhaust port.

As a result of GaN growth, the growth rate was 116 μm/h, and the decomposition rate of $NH_3$ was 100%. No parasitic growth of GaN was confirmed on the reactor wall or exhaust piping downstream of the substrate susceptor.

Example 3

For the growth conditions, the temperature of the growth chamber was 1200° C. and the temperature of the raw material chamber was 1100° C. The partial pressure of $Ga_2O$ gas was 0.00109 atm, the partial pressure of $H_2O$ gas was 0.00044 atm, the partial pressure of $NH_3$ gas was 0.15748 atm, the partial pressure of $H_2$ gas was 0.71850 atm, the partial pressure of $N_2$ gas was 0.12249 atm, and crystal growth was performed for 1 hour. As a decomposition promoting part, an annular-shaped porous Ni having a surface area 63.818 times the cross-sectional area of the reactor (normalized surface area of 63.818) was disposed downstream of the substrate susceptor, i.e., between the substrate susceptor and the exhaust port.

As a result of GaN growth, the growth rate was 111 μm/h, and the decomposition rate of $NH_3$ was 100%. No parasitic growth of GaN was confirmed on the reactor wall or exhaust piping downstream of the substrate susceptor.

Example 4

For the growth conditions, the temperature of the growth chamber was 1200° C. and the temperature of the raw material chamber was 1100° C. The partial pressure of $Ga_2O$ gas was 0.00107 atm, the partial pressure of $H_2O$ gas was 0.00046 atm, the partial pressure of $NH_3$ gas was 0.15748 atm, the partial pressure of $H_2$ gas was 0.71850 atm, the partial pressure of $N_2$ gas as 0.12249 atm, and crystal growth was performed for 1 hour. As the decomposition promoting part, an annular-shaped multilayer Mo punching plate having a surface area 2.506 times the cross-sectional area of the reactor (normalized surface area of 2.506) was disposed downstream of the substrate susceptor.

As a result of growing GaN, the growth rate was 100 μm/h, and the decomposition rate of $NH_3$ was 78.7%. Almost no parasitic growth of GaN on the reactor wall and exhaust piping downstream of the substrate susceptor was confirmed.

Example 5

For the growth conditions, the temperature of the growth chamber was 1200° C. and the temperature of the raw material chamber was 1100° C. The partial pressure of $Ga_2O$ gas was 0.00107 atm, the partial pressure of $H_2O$ gas was 0.00046 atm, the partial pressure of $NH_3$ gas was 0.15748 atm, the partial pressure of $H_2$ gas was 0.71850 atm, the partial pressure of $N_2$ gas was 0.12249 atm, and crystal growth was performed for 1 hour. As the decomposition promoting part, an annular-shaped multilayer Mo punching plate having a surface area 5.011 times the cross-sectional area of the reactor (normalized surface area of 5.011) was disposed downstream of the substrate susceptor.

As a result of growing GaN, the growth rate was 118 μm/h, and the decomposition rate of $NH_3$ was 89.2%. No parasitic growth of GaN was confirmed on the reactor wall or exhaust piping downstream of the substrate susceptor.

Example 6

For the growth conditions, the temperature of the growth chamber was 1200° C. and the temperature of the raw material chamber was 1100° C. The partial pressure of $Ga_2O$ gas was 0.00105 atm, the partial pressure of $H_2O$ gas was 0.00048 atm, the partial pressure of $NH_3$ gas was 0.15749 atm, the partial pressure of $H_2$ gas is 0.71849 atm, the partial pressure of $N_2$ gas is 0.12249 atm, and crystal growth was performed for 1 hour. As the decomposition promoting part, an annular-shaped multilayer Mo punching plate having a surface area 5.011 times the cross-sectional area of the reactor (normalized surface area of 5.011) was disposed in downstream of the substrate susceptor.

As a result of growing GaN, the growth rate was 112 μm/h, and the decomposition rate of $NH_3$ was 91.7%. No parasitic growth of GaN was confirmed on the reactor wall or exhaust piping downstream of the substrate susceptor.

Comparative Example 1

For the growth conditions, the temperature of the growth chamber was 1200° C. and the temperature of the raw material chamber was 1100° C. The partial pressure of $Ga_2O$ gas was 0.00105 atm, the partial pressure of $H_2O$ gas was 0.00048 atm, the partial pressure of $NH_3$ gas was 0.15749 atm, the partial pressure of $H_2$ gas was 0.71849 atm, the partial pressure of $N_2$ gas was 0.12249 atm, and crystal growth was performed for 1 hour. The decomposition promoting part was not disposed.

As a result of growing GaN, the growth rate was 98 μm/h, and the decomposition rate of $NH_3$ was 10.4%. Parasitic growth of GaN on the reactor wall and exhaust piping downstream of the substrate susceptor was confirmed.

Summary of Examples and Comparative Example

FIG. 3 is a graph showing a relationship between the normalized surface area of the decomposition promoting part and the decomposition rate of $NH_3$ gas. This graph is formed by plotting the decomposition rates of $NH_3$ gas obtained from Examples and Comparative Example and the normalized value (normalized surface area) of the surface area of the decomposition promoting part and connecting the values with straight lines. A cross mark was plotted when the parasitic growth of GaN was confirmed on the reactor wall and exhaust piping downstream of the substrate susceptor, a white circle was plotted when almost no parasitic growth of GaN was confirmed, and a black circle was plotted when no parasitic growth of GaN was confirmed. As shown in this graph, in Comparative Example 1 in which the decomposition promoting part was not disposed, although the $NH_3$ gas was slightly decomposed due to thermal decomposition, the decomposition rate was low. Therefore, the parasitic growth of GaN was not suppressed on the reactor wall and the exhaust pipe downstream of the substrate susceptor.

On the other hand, in Examples 1 to 6 in which the decomposition promoting part was disposed, the decomposition rate of $NH_3$ gas is increased by the decomposition promoting part. Therefore, the $NH_3$ gas was sufficiently decomposed, so that the parasitic growth of GaN was suppressed on the reactor wall and the exhaust pipe downstream of the substrate susceptor. Furthermore, as shown in the graph, the decomposition rate can be made higher by increasing the surface area of the decomposition promoting part. Particularly, when the normalized surface area of the decomposition promoting part is 5 or more, the occurrence of parasitic growth can further be suppressed. Furthermore, when the normalized surface area of the decomposition promoting part is 16.5 or more, the decomposition rate of $NH_3$ gas can be 95% or more, and when the normalized surface area is 32 or more, the decomposition rate of $NH_3$ gas can be 100%.

The present disclosure includes appropriately combining any embodiments and/or examples out of the various embodiments and/or examples described above, and the effects of the respective embodiments and/or examples can be produced.

According to the group III nitride crystal manufacturing apparatus and the group III nitride crystal manufacturing method according to the present invention, since the decomposition promoting part for an unreacted residual gas is included, the unreacted nitrogen element-containing gas can be decomposed downstream of the substrate susceptor. As a result, the parasitic growth of group III nitride crystals can be suppressed on the reactor wall and exhaust piping in the growth chamber.

EXPLANATIONS OF LETTERS OR NUMERALS

100 raw material chamber
101 raw material reaction chamber
102 first carrier gas supply port
103 reactive gas supply pipe
104 raw material boat
105 starting group III element source
106 first heater
107 group III element oxide gas discharge port
108 gas discharge port
109 connection pipe
110 third heater
111 growth chamber
112 third carrier gas supply port
113 nitrogen element-containing gas supply port
114 second carrier gas supply port
115 second heater
116 seed substrate
117 substrate susceptor
118 gas supply port
119 exhaust port
120 decomposition promoting part

What is claimed is:

1. A group III nitride crystal manufacturing apparatus comprising:

a raw material chamber generating a group III elemental oxide gas; and a growth chamber allowing the group III element oxide gas supplied from the raw material chamber to react with a nitrogen element-containing gas to generate a group III nitride crystal on a seed substrate, wherein the growth chamber comprises:

a seed substrate for growing the group III nitride crystal, an exhaust port for exhausting unreacted group III oxide gas and the nitrogen element-containing gas, and a decomposition promoting layer having a catalytic effect for a decomposition reaction of the nitrogen element-containing gas, the decomposition promoting layer being disposed between the seed substrate and the exhaust port such that the unreacted group III oxide gas and the nitrogen element-containing gas pass through the decomposition promoting layer before exiting the growth chamber via the exhaust port.

2. The group III nitride crystal manufacturing apparatus according to claim 1, wherein the total surface area of the decomposition promoting layer is 5 times or more the cross-sectional area of the growth chamber.

3. The group III nitride crystal manufacturing apparatus according to claim 1, wherein the decomposition promoting layer is located in a region of the growing chamber having a temperature that is 800° C. or higher.

4. The group III nitride crystal manufacturing apparatus according to claim 1, wherein the growth chamber is vertically arranged such that the group III element oxide gas supplied from the raw material chamber enters a top of the growth chamber and flows in a downward direction from the top of the growth chamber.

5. The group III nitride crystal manufacturing apparatus according to claim 4, wherein the group III element oxide gas and the nitrogen element-containing gas are supplied to a top of the growth chamber and flow in a downward direction within the growth chamber such that the unreacted group III oxide gas and the nitrogen element-containing gas flow past the seed substrate and pass through the decomposition promoting layer before exiting the growth chamber via the exhaust port.

6. The group III nitride crystal manufacturing apparatus according to claim 4, wherein the seed substrate is perpendicular to side walls of the growth chamber.

7. The group III nitride crystal manufacturing apparatus according to claim 1, wherein the group III elemental oxide gas comprises $Ga_2O$ and/or $Ga_2O_3$.

8. The group III nitride crystal manufacturing apparatus according to claim 1, wherein the nitrogen element-containing gas comprises at least one selected from the group consisting of $NH_3$, NO, $NO_2$, $N_2O$, $N_2O_4$, $N_2H_2$, and $N_2H_4$.

9. The group III nitride crystal manufacturing apparatus according to claim 1, wherein the group III nitride crystal is GaN.

10. The group III nitride crystal manufacturing apparatus according to claim 1, wherein the seed substrate is made of a material selected from the group consisting of gallium nitride, gallium arsenide, silicon, sapphire, silicon carbide, zinc oxide, gallium oxide, and $ScAlMgO_4$.

11. The group III nitride crystal manufacturing apparatus according to claim 1, wherein the decomposition promoting layer comprises at least one element selected from the group consisting of Mo, Ni, Fe, Co, Ti, Cr, Zr, Ta, W, and Pt.

12. The group III nitride crystal manufacturing apparatus according to claim 1, wherein the decomposition promoting layer comprises at least one element selected from the group consisting of Mo, Ta, Zr, Cr, and Pt.

13. The group III nitride crystal manufacturing apparatus according to claim 1, wherein the decomposition promoting layer is a metal plate, a multilayer metal body, a porous metal body, or a sponge-like metal.

14. The group III nitride crystal manufacturing apparatus according to claim 1, wherein the decomposition promoting layer comprises a honeycomb structure of metal or ceramic having particles of at least one element selected from the group consisting of Mo, Ta, Zr, Cr, and Pt disposed thereupon.

15. A group III nitride crystal manufacturing apparatus comprising:

a raw material chamber generating a group III elemental oxide gas; and a growth chamber allowing the group III element oxide gas supplied from the raw material chamber to react with a nitrogen element-containing gas to generate a group III nitride crystal on a seed substrate, wherein the growth chamber comprises:

a seed substrate for growing the group III nitride crystal, an exhaust port for exhausting unreacted group III oxide gas and the nitrogen element-containing gas, and a decomposition promoting layer disposed in a region between the seed substrate and the exhaust port such that the unreacted group III oxide gas and the nitrogen element-containing gas pass through the decomposition promoting layer before exiting the growth chamber via the exhaust port, the decomposition promoting layer being adapted to provide a catalytic effect for a decomposition reaction of the nitrogen element-containing gas in the region between the seed substrate and the exhaust port.

16. A group III nitride crystal manufacturing apparatus comprising:

a raw material chamber generating a group III elemental oxide gas; and a growth chamber allowing the group III element oxide gas supplied from the raw material chamber to react with a nitrogen element-containing gas to generate a group III nitride crystal on a seed substrate, wherein the growth chamber comprises:

a seed substrate for growing the group III nitride crystal, an exhaust port for exhausting unreacted group III oxide gas and the nitrogen element-containing gas, and a decomposition promoting layer having a catalytic effect for a decomposition reaction of the nitrogen element-containing gas, wherein the decomposition promoting layer is disposed between the seed substrate and the exhaust port and extends from a wall of the growth chamber such that all of the unreacted group III oxide gas and the nitrogen element-containing gas flowing downstream of the seed substrate passes through the decomposition promoting layer before exiting the growth chamber via the exhaust port.

* * * * *